United States Patent
Woody et al.

(10) Patent No.: US 9,537,100 B2
(45) Date of Patent: Jan. 3, 2017

(54) PROCESS OF PRODUCING AND APPLICATIONS OF THREE COMPONENT BENZO[1,2-B:4,5-B] DITHIOPHENE-THIENOTHIOPHENE RANDOMLY SUBSTITUTED POLYMERS FOR ORGANIC SOLAR CELLS

(71) Applicant: PHILLIPS 66 COMPANY, Houston, TX (US)

(72) Inventors: Kathy Woody, Bartlesville, OK (US); Hui Huang, Beijing (CN); Ting He, Bartlesville, OK (US)

(73) Assignee: Phillips 66 Company, Houston, TX (US)

( * ) Notice: Subject to any disclaimer, the term of this patent is extended or adjusted under 35 U.S.C. 154(b) by 0 days.

(21) Appl. No.: 14/722,433

(22) Filed: May 27, 2015

(65) Prior Publication Data
US 2015/0349259 A1 Dec. 3, 2015

Related U.S. Application Data

(60) Provisional application No. 62/005,191, filed on May 30, 2014.

(51) Int. Cl.
C08G 75/00 (2006.01)
H01L 51/00 (2006.01)
H01L 51/42 (2006.01)

(52) U.S. Cl.
CPC ....... *H01L 51/0036* (2013.01); *H01L 51/0043* (2013.01); *H01L 51/0047* (2013.01); *H01L 51/4253* (2013.01); *Y02E 10/549* (2013.01)

(58) Field of Classification Search
CPC ............. H01L 51/0036; H01L 51/0047; C08G 2261/3243; C08G 2261/414; C08G 2261/124; C08G 2261/91
See application file for complete search history.

(56) References Cited

U.S. PATENT DOCUMENTS 8,436,134 B2 5/2013 Yu et al.
8,653,228 B2 2/2014 Yu et al.
(Continued)

FOREIGN PATENT DOCUMENTS

WO 2010008672 1/2010

OTHER PUBLICATIONS

PCT Notification of Transmittal of the International Search Report and the Written Opinion of the International Searching Authority, or the Declaration, Date of Mailing: Aug. 19, 2015, International Filing Date: May 28, 2015, International Application No. PCT/US2015/032861, 12 pages.

*Primary Examiner* — Shane Fang
(74) *Attorney, Agent, or Firm* — Phillips 66 Company

(57) ABSTRACT

A process of polymerizing

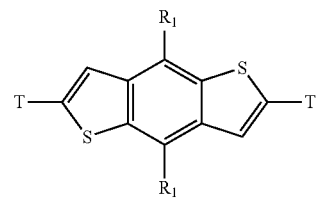

f with (Continued)

Current-voltage diagram of the 9.46% PCE P(BDT-FTT(P50)) solar cell

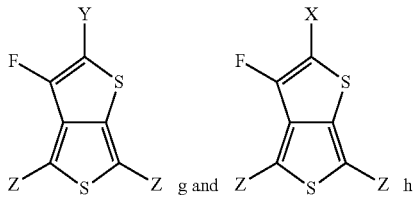

wherein the stoichiometric ratio of f≈(g+h) and f, g and h are not equal to 0.

This process can also have R1 selected from the group consisting of alkyl group, alkoxy group, aryl groups and combinations thereof. Additionally, x and y can be different from each other and can be independently selected from the group consisting of: alkyl group, alkoxy group, aryl groups,

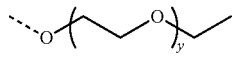

where y=1-3,

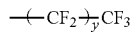

where y=0-12,

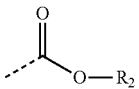

where R2 is selected from the group consisting of H, alkyl group, alkoxy group, aryl groups,

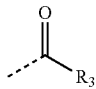

where R3 is selected from the group consisting of H, alkyl group, alkoxy group, aryl groups,

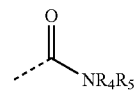

where R4 and R5 are independently selected from the group consisting of H, alkyl group, alkoxy group, aryl groups, —NR$_6$R$_7$ where R6 and R7 are independently selected from the group consisting of H, alkyl group, alkoxy group, aryl groups.

17 Claims, 1 Drawing Sheet

(56) References Cited

U.S. PATENT DOCUMENTS

| | | |
|---|---|---|
| 8,703,960 B2 | 4/2014 | Huang |
| 8,895,751 B2 | 11/2014 | Huang |
| 2003/0092869 A1 | 5/2003 | Yu |
| 2012/0279568 A1* | 11/2012 | Choi ............... H01L 51/0036 136/263 |
| 2013/0056071 A1 | 3/2013 | Palkar et al. |
| 2013/0214213 A1 | 8/2013 | Wang et al. |
| 2014/0151657 A1 | 6/2014 | Wang et al. |
| 2014/0221590 A1 | 8/2014 | Woody et al. |
| 2015/0136224 A1 | 5/2015 | Shi et al. |
| 2015/0210800 A1 | 7/2015 | Wang et al. |

* cited by examiner

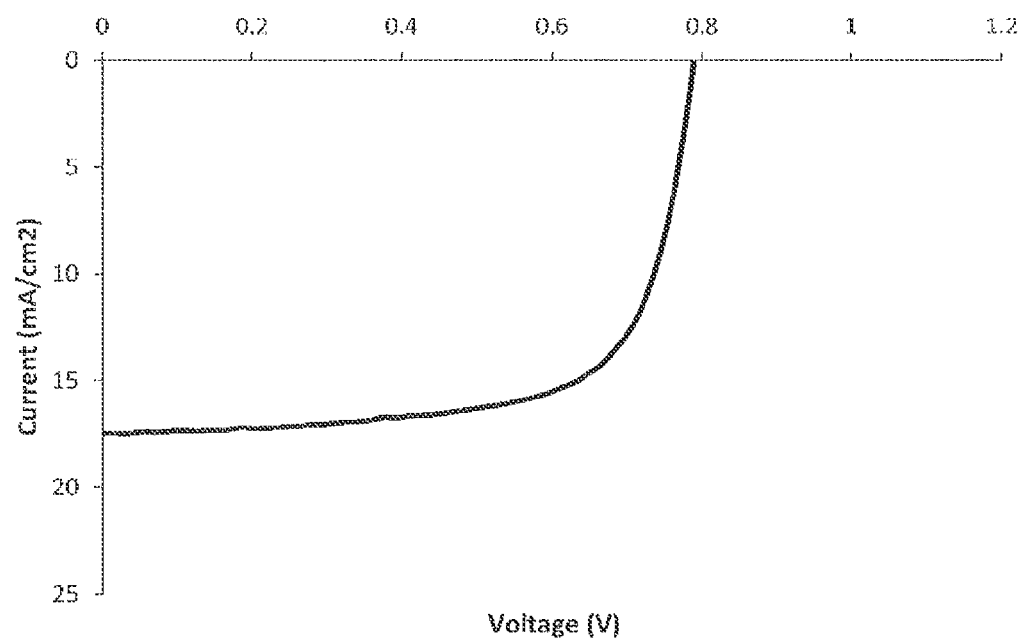
Current-voltage diagram of the 9.46% PCE P(BDT-FTT(P50)) solar cell

PROCESS OF PRODUCING AND APPLICATIONS OF THREE COMPONENT BENZO[1,2-B:4,5-B] DITHIOPHENE-THIENOTHIOPHENE RANDOMLY SUBSTITUTED POLYMERS FOR ORGANIC SOLAR CELLS

CROSS-REFERENCE TO RELATED APPLICATIONS

This application is a non-provisional application which claims the benefit of and priority to U.S. Provisional Application Ser. No. 62/005,191 filed May 30, 2014, entitled "Process of Producing and Applications of Three Component Benzo[1,2-B:4,5-B]Dithiophene-Thienothiophene Randomly Substituted Polymers for Organic Solar Cells," which is hereby incorporated by reference in its entirety.

STATEMENT REGARDING FEDERALLY SPONSORED RESEARCH OR DEVELOPMENT

None.

FIELD OF THE INVENTION

This invention relates to a process of producing and applications for a three component benzo[1,2-b:4,5-b]dithiophene-thienothiophene polymer.

BACKGROUND OF THE INVENTION

Solar energy using photovoltaic effect requires active semiconducting materials to convert light into electricity. Currently, solar cells based on silicon are the dominating technology due to their high conversion efficiency. Recently, solar cells based on organic materials showed interesting features, especially on the potential of low cost in materials and processing. Judging from the recent success in organic light emitting diodes based on a reverse effect of photovoltaic effect, organic solar cells are very promising.

Organic photovoltaic cells have many potential advantages when compared to traditional silicon-based devices. Organic photovoltaic cells are light weight, economical in the materials used, and can be deposited on low cost substrates, such as flexible plastic foils. However, organic photovoltaic devices typically have relatively low quantum yield (the ratio of photons absorbed to carrier pairs generated. This is, in part, thought to be due to the second order nature of the intrinsic photoconductive process. That is, carrier generation requires exciton generation, diffusion and ionization. The diffusion length of an exciton is typically much less than the optical absorption length, requiring a tradeoff between using a thick, and therefore resistive, cell with multiple or highly folded interfaces, or a thin cell with a low optical absorption efficiency.

Conjugated polymers are polymers containing π-electron conjugated units along the main chain. They can be used as active layer materials for some types of photo-electric devices, such as polymer light emitting devices, polymer solar cells, polymer field effect transistors, etc. As polymer solar cell materials, conjugated polymers should possess some properties, such as high mobility, good harvest of sunlight, good processibility, and proper molecular energy level. Some conjugated polymers have proven to be good solar cell materials. Conjugated polymers are made of alternating single and double covalent bonds. The conjugated polymers have a 6-bond backbone of intersecting $sp^2$ hybrid orbitals. The $p_z$ orbitals on the carbon atoms overlap with neighboring $p_z$ orbitals to provide π-bonds. The electrons that comprise the π-bonds are delocalized over the whole molecule. These polymers exhibit electronic properties similar to those seen in inorganic semiconductors. The semiconducting properties of the photovoltaic polymers are derived from their delocalized π bonds. The substituents of the polymers also largely influence the electronic properties. The optical bandgap, mobility and thin-film morphology are affected by both the type of functional group used as a substituent and the bulkiness and length of the side chain. Polymers which have only minor differences in the side chains will have large differences in the device performance.

There is a need in the art for polymer solar cells that exhibit increased solar conversion efficiency.

BRIEF SUMMARY OF THE DISCLOSURE

A process of polymerizing

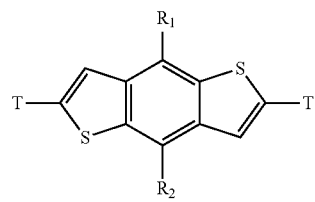

f with

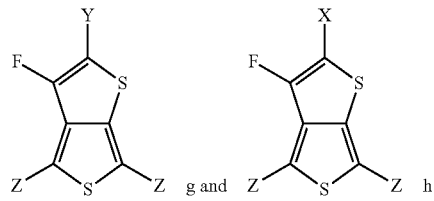

g and h wherein the stoichiometric ratio of f≈(g+h) and f, g and h are not equal to 0.

This process can also have R1 selected from the group consisting of alkyl group, alkoxy group, aryl groups and combinations thereof. Additionally, x and y can be different from each other and can be independently selected from the group consisting of: alkyl group, alkoxy group, aryl groups,

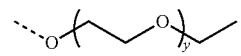

where y=1-3,

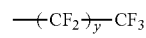

where y=0-12,

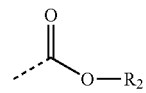

where R2 is selected from the group consisting of H, alkyl group, alkoxy group, aryl groups,

where R3 is selected from the group consisting of H, alkyl group, alkoxy group, aryl groups,

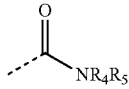

where R4 and R5 are independently selected from the group consisting of H, alkyl group, alkoxy group, aryl groups, —NR$_6$R$_7$ where R6 and R7 are independently selected from the group consisting of H, alkyl group, alkoxy group, aryl groups.

In another embodiment a process is taught of A process of polymerizing

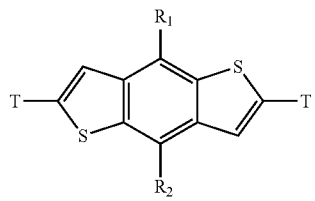

f with

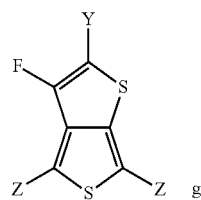

g and

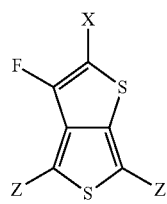

h wherein the stoichiometric ratio of f≈(g+h) and f, g and h are not equal to 0. Additionally, substituent T of compound f reacts exclusively with substituents Z of compounds g and h.

This process can also have R1 selected from the group consisting of alkyl group, alkoxy group, aryl groups and combinations thereof. Additionally, x and y can be different from each other and can be independently selected from the group consisting of: alkyl group, alkoxy group, aryl groups,

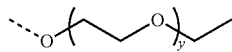

where y=1-3,

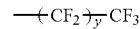

where y=0-12,

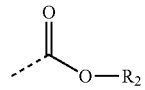

where R2 is selected from the group consisting of H, alkyl group, alkoxy group, aryl groups,

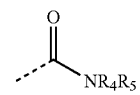

where R3 is selected from the group consisting of H, alkyl group, alkoxy group, aryl groups,

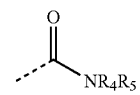

where R4 and R5 are independently selected from the group consisting of H, alkyl group, alkoxy group, aryl groups, —NR$_6$R$_7$ where R6 and R7 are independently selected from the group consisting of H, alkyl group, alkoxy group, aryl groups. Additionally, in this process the polymerization of f, g and h can be selected from stille coupling, Suzuki coupling, a nickel catalyzed reaction or direct arylation.

BRIEF DESCRIPTION OF THE DRAWINGS

A more complete understanding of the present invention and benefits thereof may be acquired by referring to the follow description taken in conjunction with the accompanying drawings in which:

FIG. 1 depicts a current-voltage diagram of a solar cell

DETAILED DESCRIPTION

Turning now to the detailed description of the preferred arrangement or arrangements of the present invention, it should be understood that the inventive features and concepts may be manifested in other arrangements and that the scope of the invention is not limited to the embodiments described or illustrated. The scope of the invention is intended only to be limited by the scope of the claims that follow.

"Alkyl," as used herein, refers to an aliphatic hydrocarbon chains. In one embodiment the aliphatic hydrocarbon chains are of 1 to about 100 carbon atoms, preferably 1 to 30 carbon atoms, more preferably, 1 to 20 carbon atoms, and even more preferably, 1 to 10 carbon atoms and includes straight and branched chains such as methyl, ethyl, n-propyl, isopropyl, n-butyl, isobutyl, sec-butyl, t-butyl, n-pentyl, isopentyl, neo-pentyl, n-hexyl, and isohexyl. In this application alkyl groups can include the possibility of substituted and unsubstituted alkyl groups.

"Alkoxy," as used herein, refers to the group R—O— where R is an alkyl group of 1 to 100 carbon atoms. In this application alkoxy groups can include the possibility of substituted and unsubstituted alkoxy groups.

"Aryl" as used herein, refers to an optionally substituted, mono-, di-, tri-, or other multicyclic aromatic ring system having from about 5 to about 50 carbon atoms (and all combinations and subcombinations of ranges and specific numbers of carbon atoms therein), with from about 6 to about 10 carbons being preferred. Non-limiting examples include, for example, phenyl, naphthyl, anthracenyl, and phenanthrenyl. Aryl groups can be optionally substituted with one or with one or more Rx. In this application aryl groups can include the possibility of substituted aryl groups, bridged aryl groups and fused aryl groups.

The present embodiment describes a process of a polymerization of

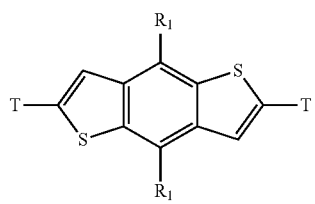

f with

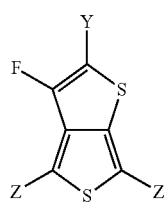

g and

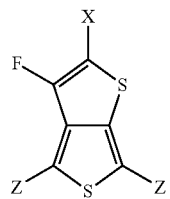

h. In this embodiment it is possible that the stoichiometric ratio of f≈(g+h) and f, g and h are not equal to 0.

In this embodiment, R1 is selected from the group consisting of alkyl group, alkoxy group, aryl groups and combinations thereof. Additionally, in this embodiment, x and y are different from each other and independently selected from the group consisting of: an alkyl group, alkoxy group, aryl groups,

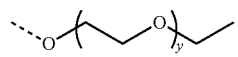

where y=1-3,

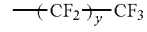

where y=0-12,

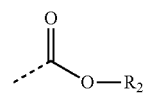

where R2 is selected from the group consisting of H, alkyl group, alkoxy group, aryl groups,

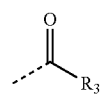

where R3 is selected from the group consisting of H, alkyl group, alkoxy group, aryl groups,

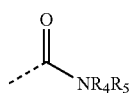

where R4 and R5 are independently selected from the group consisting of H, alkyl group, alkoxy group, aryl groups, —NR6R7 where R6 and R7 are independently selected from the group consisting of H, alkyl group, alkoxy group, aryl groups.

Different types of polymerization reactions can occur to polymerize f with g and h. The current embodiments of these processes are not limited to one specific type of polymerization reaction but can include any currently known polymerization reaction capable of reaction f with g and h. Some of these polymerization reactions include:

Stille Coupling:
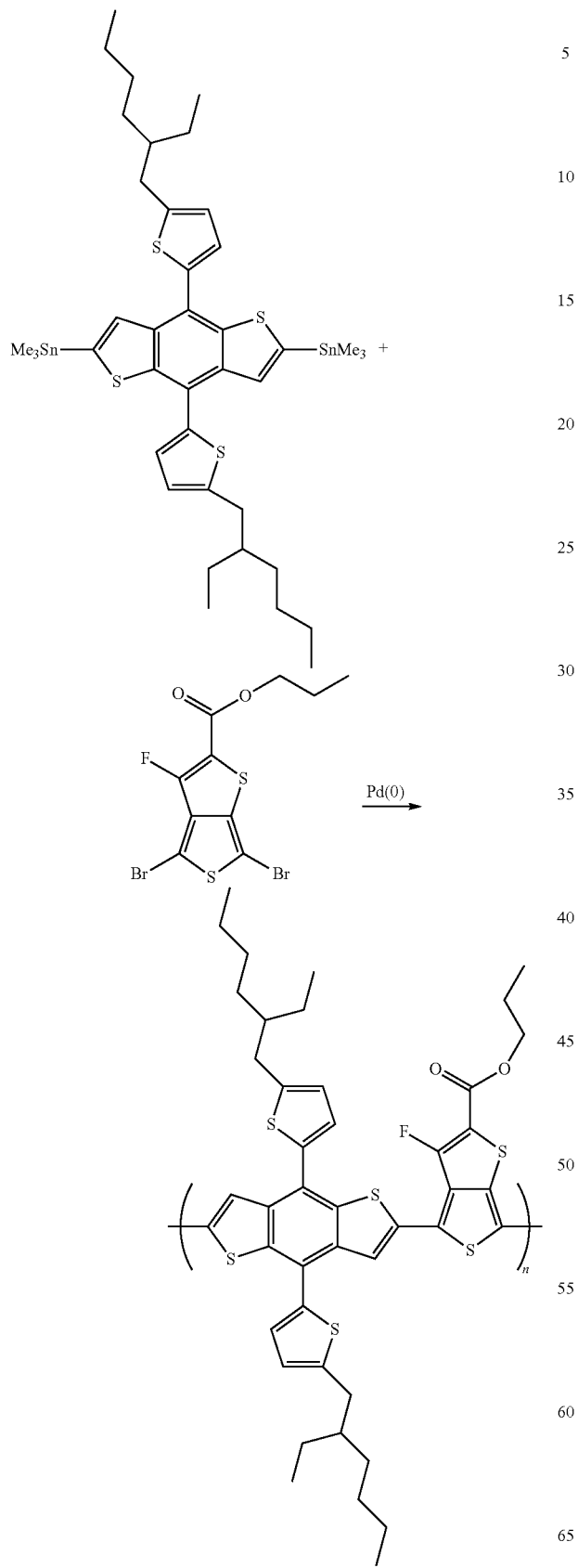
Suzuki Coupling:
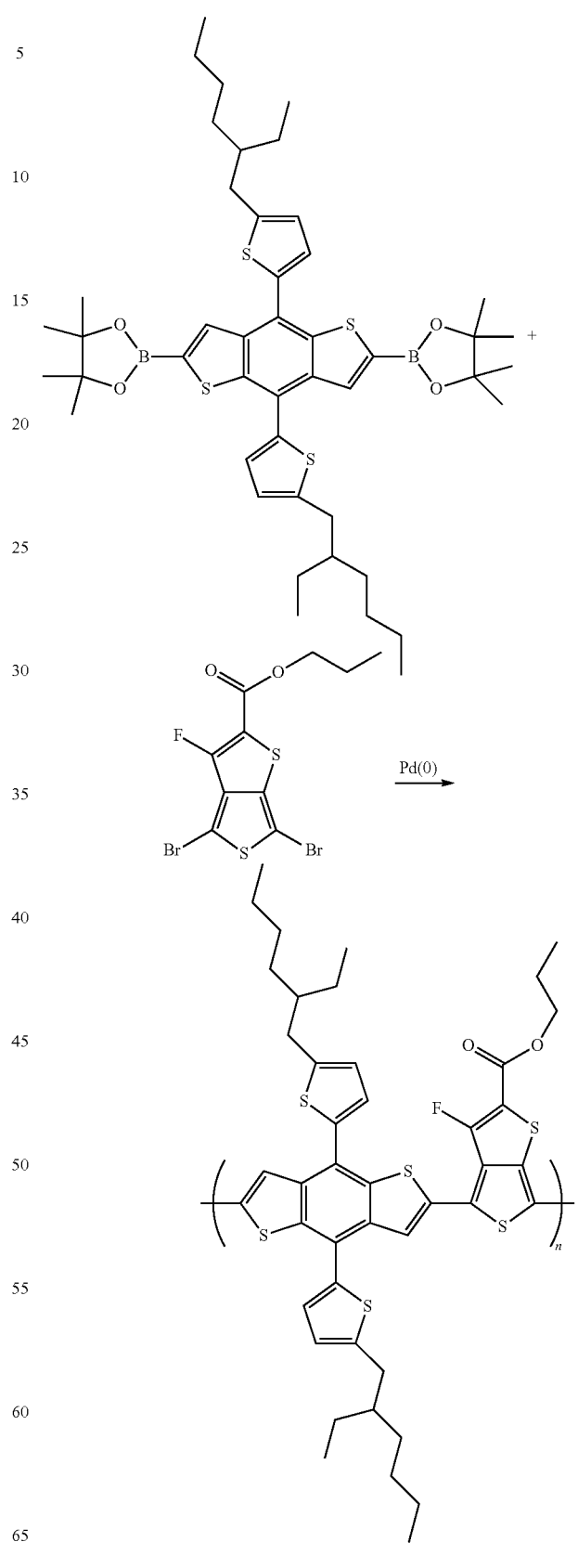

9
Nickel Catalyzed
10
Direct Arylation
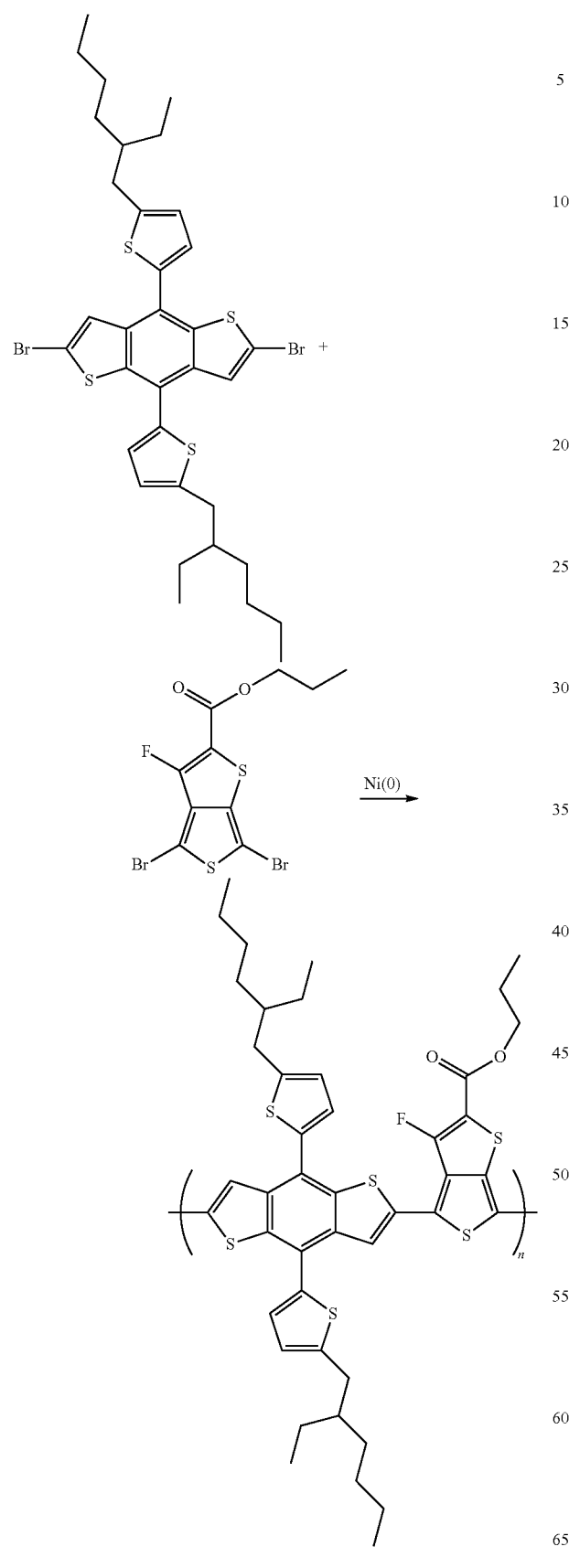
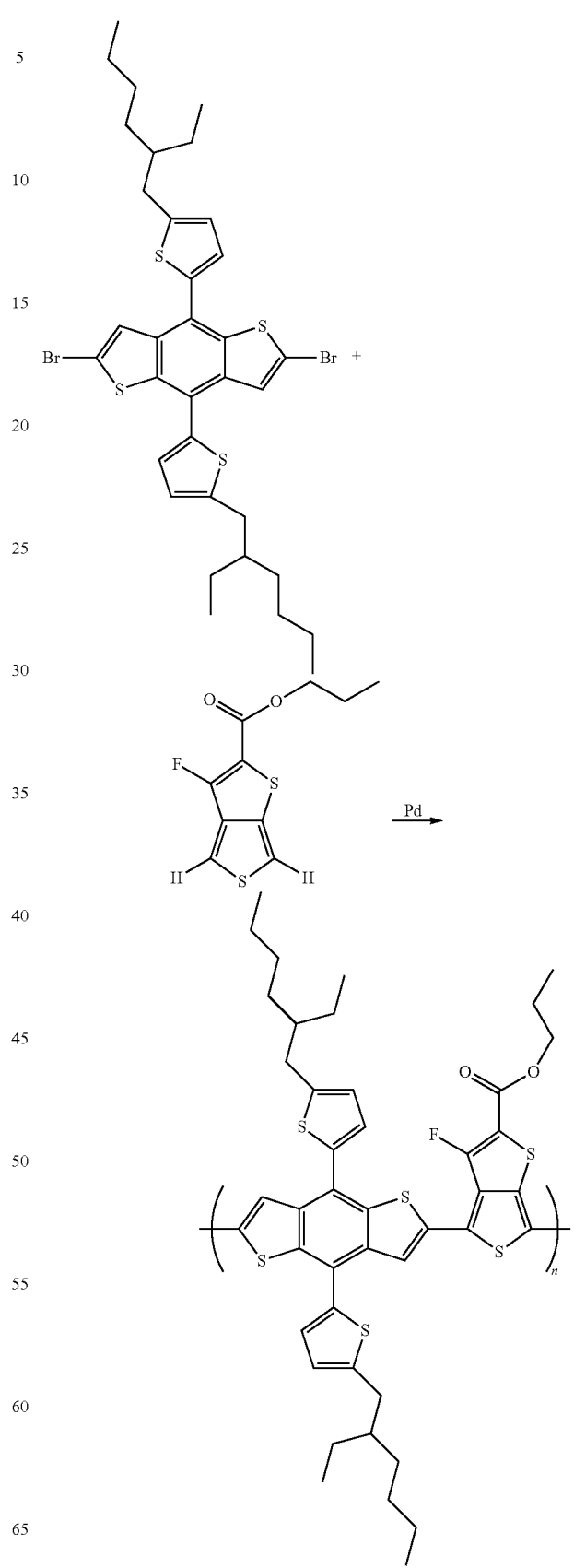

In one embodiment, the stille coupling of f, g and h is regio-regular. In an alternate embodiment the stille coupling of f, g and h is regio-random.

In one embodiment, the substituent T can be selected from Me₃Sn, C₆H₁₂O₂B, Br or any other substituent that can be used in the polymerization reaction.

In one embodiment the aromatic substituents can comprise of heterocycles and/or fused heterocycles. In one embodiment, the process produces a conjugated polymer.

Typically, the number average molecular weight of the polymers is in the range of approximately 1000 to 1,000,000, with ideal polymers having a number average molecular weight in the range of about 5000 to 500,000, and some ideal polymers having a number average molecular weight in the range of approximately 20,000 to 200,000. It will be appreciated that molecular weight can be varied to optimize polymer properties and the inventions of the present disclosure cover all molecular weights. For example, lower molecular weight can ensure solubility, while a higher molecular weight can ensure good film-forming properties.

The polymers produced from the present disclosure can be used as photovoltaic material or an active layer material in a photovoltaic device or an electronic device such as photodetector devices, solar cell devices, and the like. Photovoltaic devices, including solar cell devices, are generally comprised of laminates of a suitable photovoltaic material between a hole-collecting electrode layer and an electron-collecting layer. Additional layers, elements or a substrate may or may not be present. In one embodiment the electronic devices are field effect transistors, light emitting devices, and sensors, electrochromic devices and capacitors.

In one embodiment the ratio of

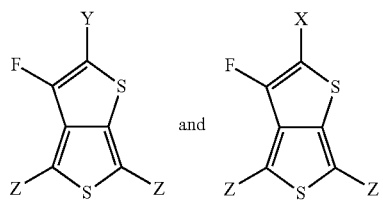

used in the process is around 50:50.

In one embodiment, the

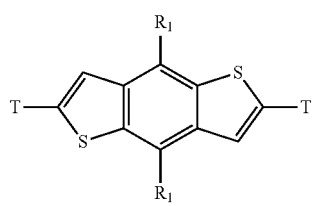

is a di-Me3Sn substituted benzo[1,2-b:4,5-b']dithiophene.

In yet another embodiment, the

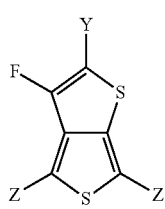

is a brominated 2-ethylhexyl substituted 3-fluorothieno[3,4-b]thiophene.

In another embodiment, the

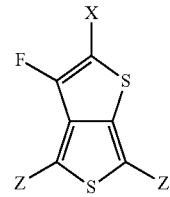

is a brominated propyl substituted 3-fluorothieno[3,4-b]thiophene.

In one embodiment, substituent T of compound f reacts exclusively with substituents Z of compounds g and h. In another embodiment, T is selected from the group consisting of Me₃Sn, C₆H₁₂O₂B, Br and combinations thereof.

The following examples of certain embodiments of the invention are given. Each example is provided by way of explanation of the invention, one of many embodiments of the invention, and the following examples should not be read to limit, or define, the scope of the invention.

EXAMPLES

List of Acronyms Used:

BDT: Benzo[1,2-b:4,5-b']dithiophene

FTT: 3-Fluorothieno[3,4-b]thiophene

FTT(E): 2-ethylhexyl 3-fluorothieno[3,4-b]thiophene-2-carboxylate

FTT(P): propyl 3-fluorothieno[3,4-b]thiophene-2-carboxylate

FTT(M): methyl 3-fluorothieno[3,4-b]thiophene-2-carboxylate

FTT(K1): 2-ethyl-1-(3-fluorothieno[3,4-b]thiophen-2-yl)hexan-1-one

FTT(K2): 1-(3-fluorothieno[3,4-b]thiophen-2-yl)butan-1-one

PCE: power conversion efficiency

Jsc: short circuit current

Voc: open circuit voltage

PDI: polydispersity index $M_n$: number average molecular weight defined by $(\Sigma N_i M_i)/\Sigma N_i$ where Mi is the molecular weight of a chain and Ni is the number of chains of that molecular weight Soxhlet Extraction: The polymer is washed using a reflux apparatus with different solvents. The solvent and polymer is then heated till the solvent evaporates into a gas, then cools into a liquid. The solvent is then evaporated off and polymer products are produced.

Example 1

P(BDT-FTT(P)), (100% FTT(P)): Monomers BDT (0.228 g, 0.252 mmol) and FTT(P) (0.101 g, 0.251 mmol) were combined in a Schlenk flask with Pd(PPh$_3$)$_4$ (14 mg), toluene (10 mL) and dimethylformamide (4 mL). The solution was heated to 130° C. and stirred for 36 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=40 kDa and PDI=2.08).

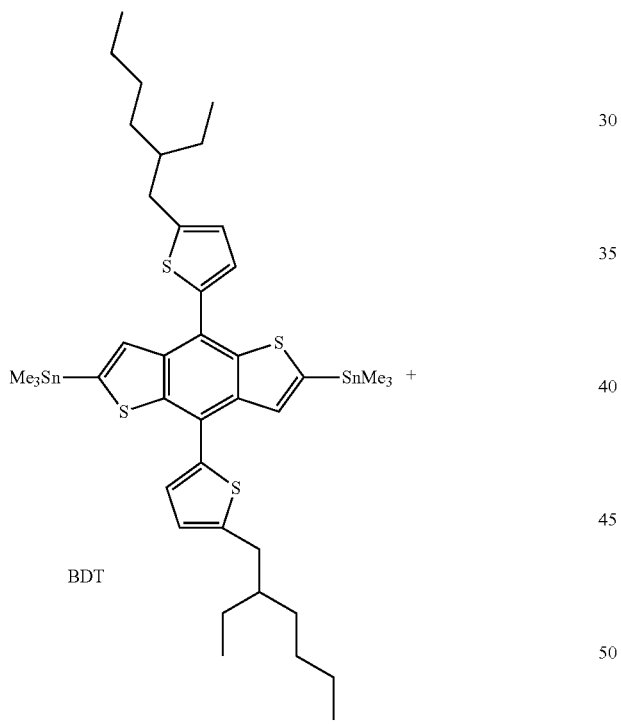

BDT

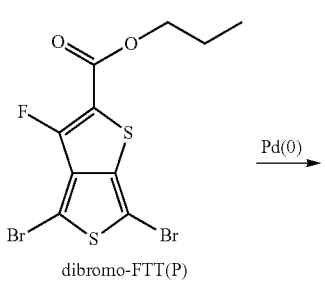

dibromo-FTT(P)

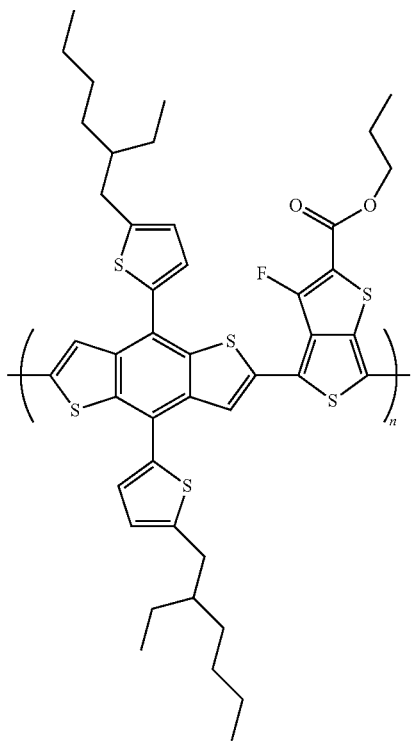

Example 2

P((BDT-FTT(P))$_{0.7}$-(BDT-FTT(E))$_{0.3}$), (70% FTT(P), 30% FTT(E)): Monomers distannyl-BDT (0.142 g, 0.157 mmol), dibromo-FTT(E) (0.022 g, 0.047 mmol) and dibromo-FTT(P) (0.044 g, 0.109 mmol) were combined in a Schlenk flask with Pd(PPh$_3$)$_4$ (12 mg), toluene (7 mL) and DMF (2.5 mL). The solution was heated to 130° C. and stirred for 24 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=17 kDa and PDI=3.70).

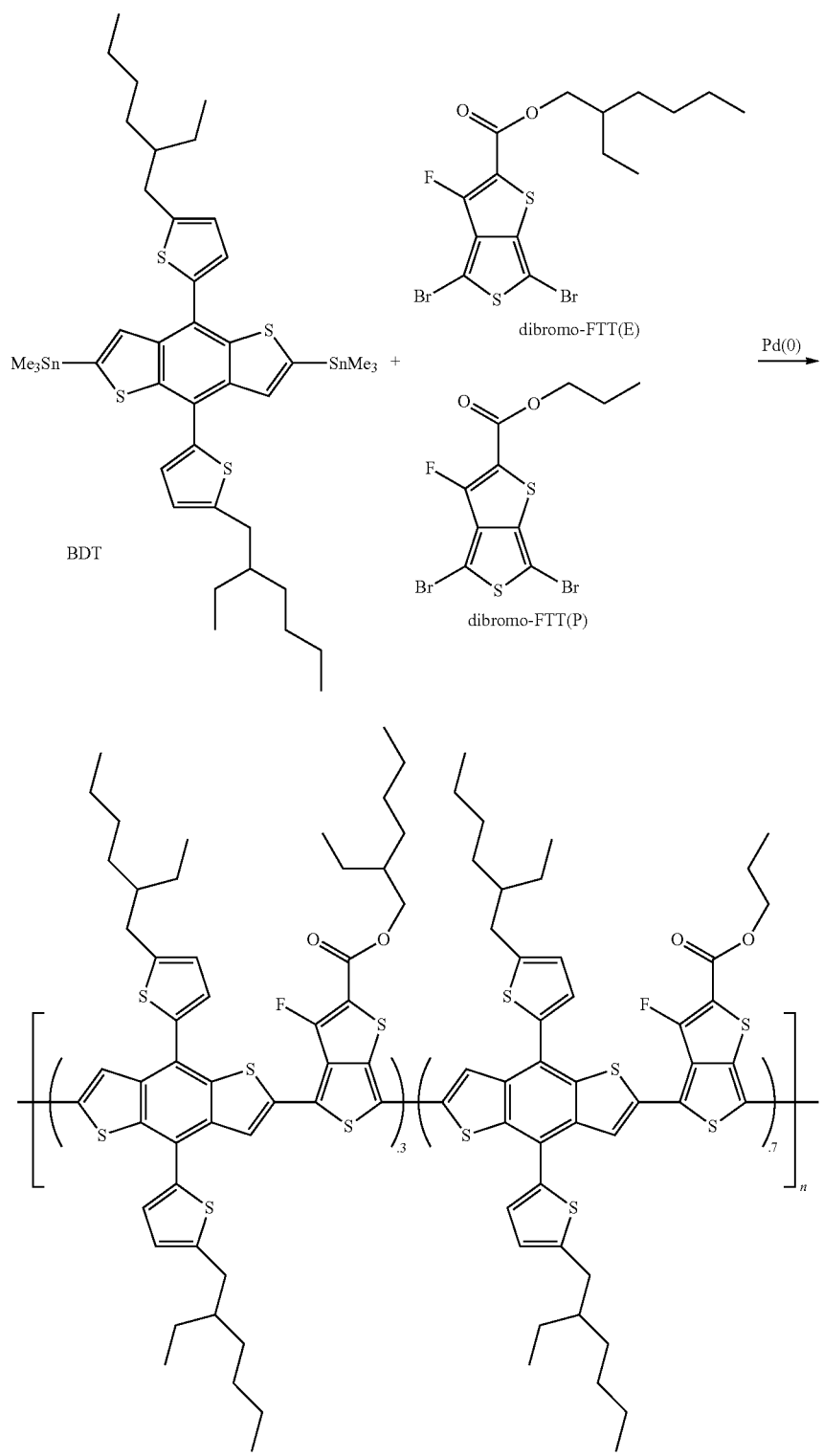

Example 3

P((BDT-FTT(P))$_{0.5}$-(BDT-FTT(E))$_{0.5}$), (50% FTT(P), 50% FTT(E)): Monomers distannyl-BDT (0.108 g, 0.119 mmol), dibromo-FTT(E) (0.028 g, 0.059 mmol) and dibromo-FTT(P) (0.024 g, 0.059 mmol) were combined in a Schlenk flask with Pd(PPh$_3$)$_4$ (7 mg), toluene (6 mL) and DMF (2 mL). The solution was heated to 130° C. and stirred for 24 h. The solution was poured into 100 mL methanol and the polymer was collected by filtration. The polymer was purified by Soxhlet extraction by washing subsequently with acetone, hexanes and chloroform. The polymer was recovered in the chloroform fraction (M$_n$=34 kDa and PDI=3.17).

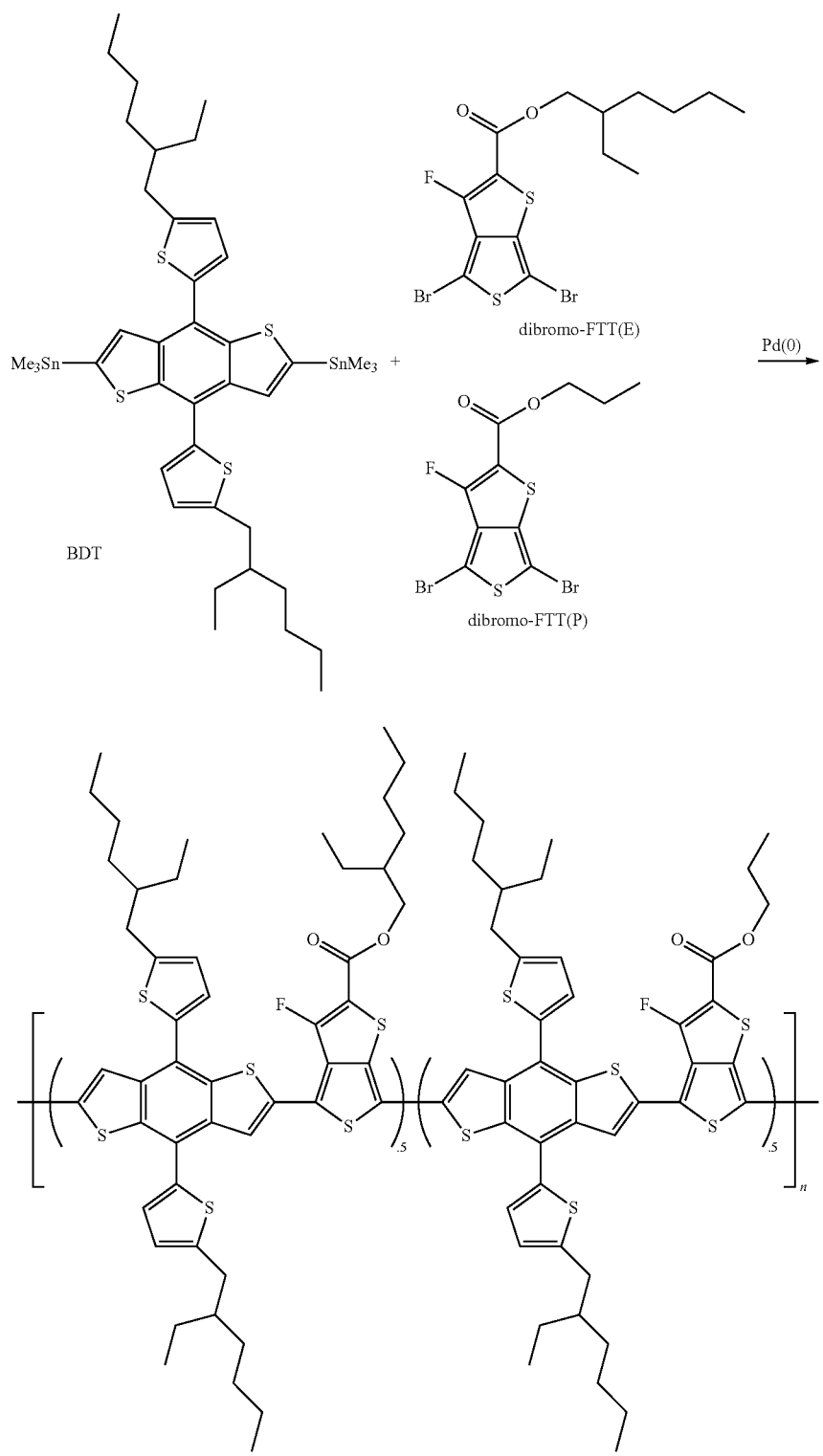

Example 4

P((BDT-FTT(P))$_{0.3}$-(BDT-FTT(E))$_{0.7}$), (30% FTT(P), 70% FTT(E)): Monomers distannyl-BDT (0.080 g, 0.088 mmol), dibromo-FTT(E) (0.029 g, 0.061 mmol) and dibromo-FTT(P) (0.011 g, 0.027 mmol) were combined in a Schlenk flask with Pd(PPh$_3$)$_4$ (5 mg), toluene (6 mL) and DMF (3 mL). The solution was heated to 130° C. and stirred for 36 h. The solution was poured into 100 mL methanol and the polymer was collected by filtration. The polymer was purified by Soxhlet extraction by washing subsequently with acetone, hexanes and chloroform. The polymer was recovered in the chloroform fraction (M$_n$=63 kDa and PDI=2.96).

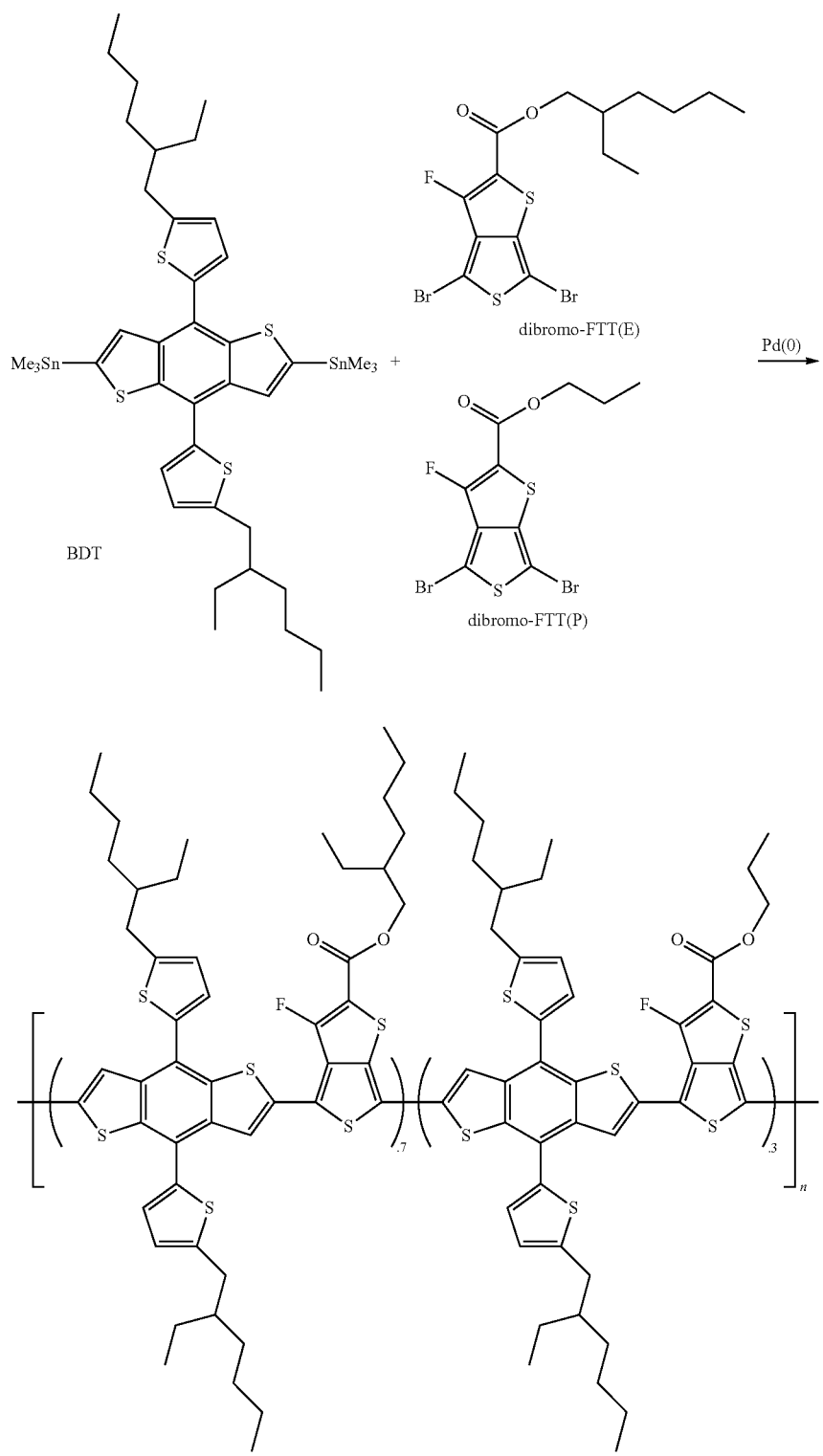

Example 5

P((BDT-FTT(P))$_{0.1}$-(BDT-FTT(E))$_{0.9}$) (10% FTT(P), 90% FTT(E)): Monomers distannyl-BDT (0.093 g, 0.103 mmol), dibromo-FTT(E) (0.044 g, 0.093 mmol) and dibromo-FTT(P) (0.004 g, 0.010 mmol) were combined in a Schlenk flask with Pd(PPh$_3$)$_4$ (6 mg), toluene (6 mL) and DMF (2 mL). The solution was heated to 130° C. and stirred for 24 h. The solution was poured into 100 mL methanol and the polymer was collected by filtration. The polymer was purified by Soxhlet extraction by washing subsequently with acetone, hexanes and chloroform. The polymer was recovered in the chloroform fraction (M$_n$=24 kDa and PDI=2.08).

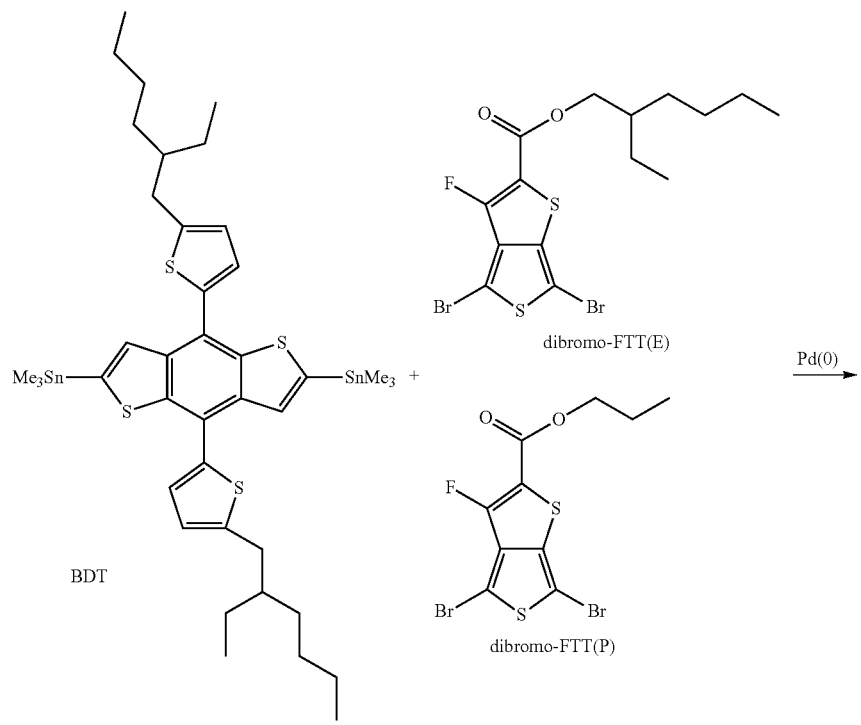
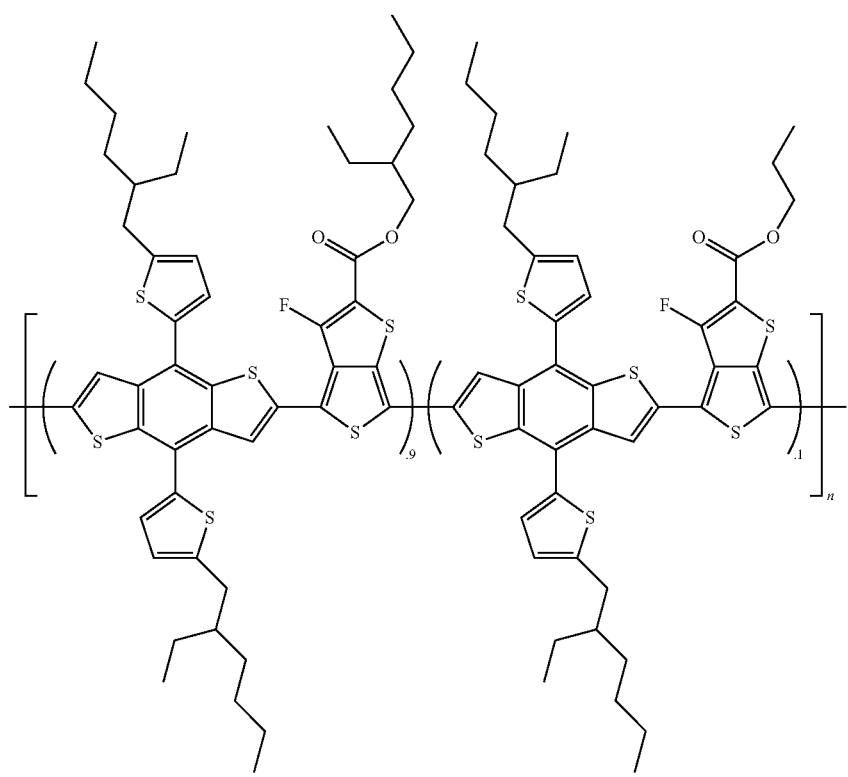

Example 6

P(BDT-FTT(E)), (100% FTT(E)): Monomers distannyl-BDT (0.115 g, 0.127 mmol)) and dibromo-FTT(E) (0.060 g, 0.127 mmol) were combined in a Schlenk flask with Pd(PPh$_3$)$_4$ (7 mg) in toluene (4 mL) and DMF (1 mL). The solution was heated to 115° C. and stirred for 96 h. The solution was poured into 100 mL methanol and the polymer was collected by filtration. The polymer was purified by Soxhlet extraction by washing subsequently with acetone, hexanes and chloroform. The polymer was recovered in the chloroform fraction (M$_n$=24 kDa and PDI=2.1).

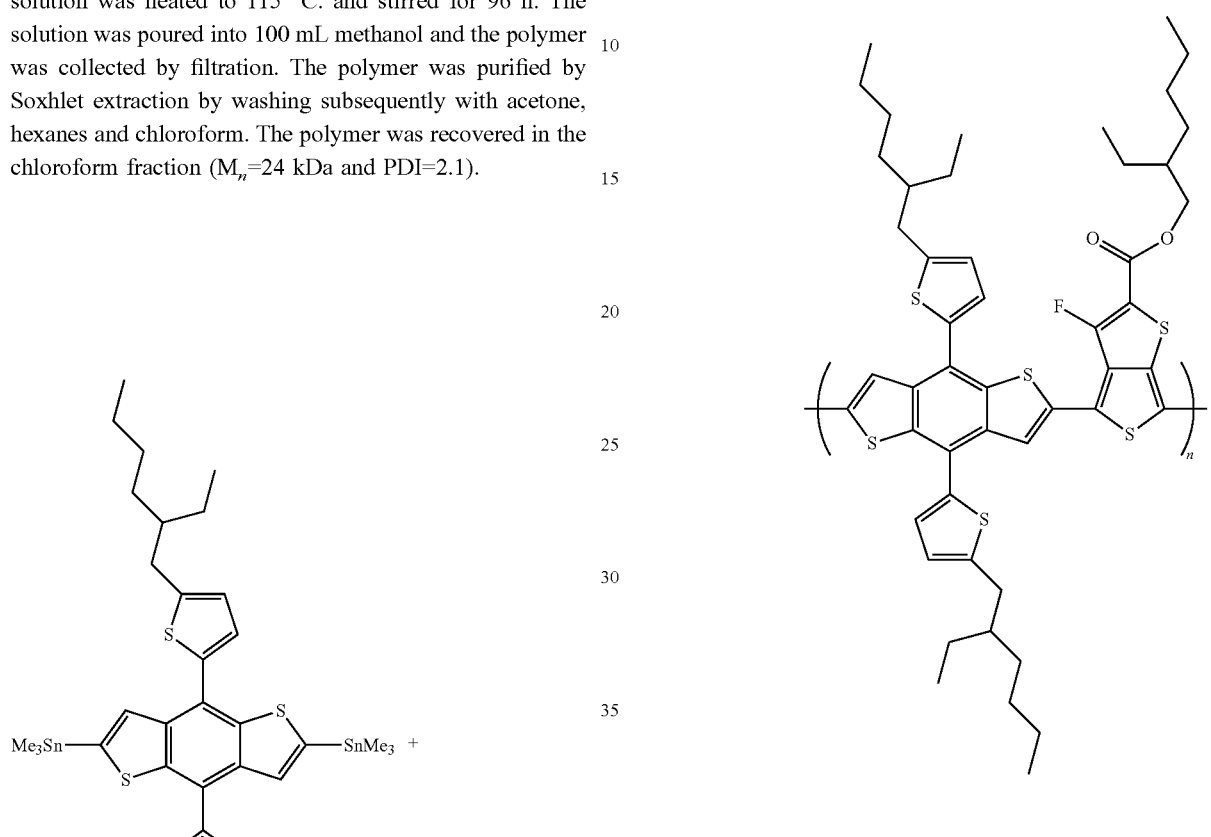

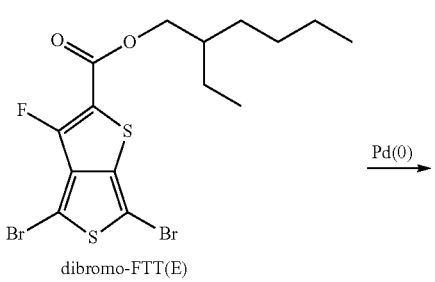

Example 7

P((BDT-FTT(E))$_{0.25}$-(BDT-FTT(K1))$_{0.75}$) Monomers distannyl-BDT (0.10 g, 0.11 mmol)), dibromo-FTT(E) (13 mg, 0.0275 mmol) and dibromo-FTT(K1) (36.5 mg, 0.0825 mmol) were combined in a Schlenk flask with Pd(PPh$_3$)$_4$ (12.8 mg) in toluene (4.4 mL) and DMF (1.1 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction (M$_n$=41 kDa and PDI=2.9).

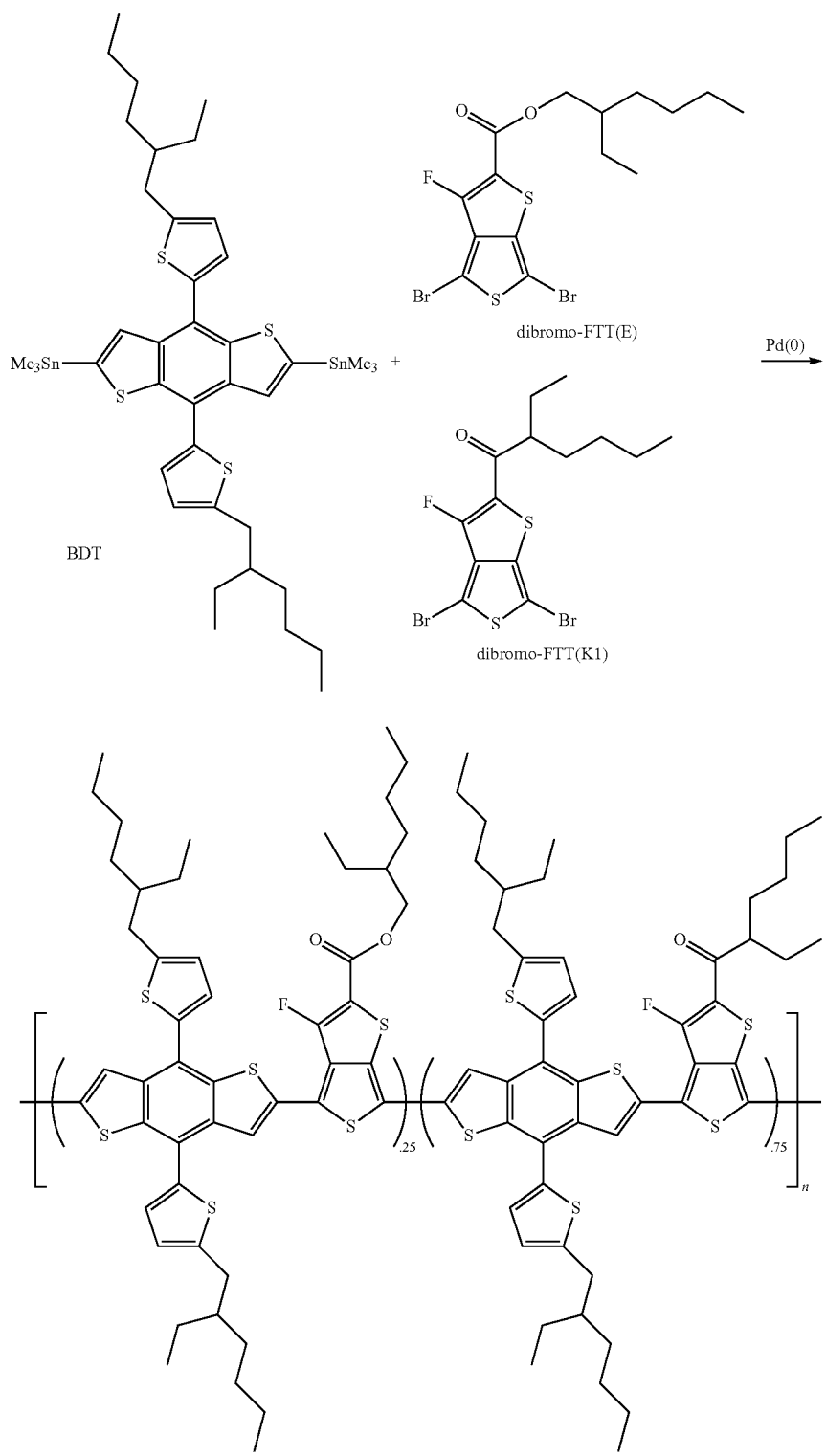

Example 8

P((BDT-FTT(E))$_{0.5}$-(BDT-FTT(K1))$_{0.5}$) Monomers distannyl-BDT (100 mg, 0.11 mmol)), dibromo-FTT(E) (26 mg, 0.055 mmol) and dibromo-FTT(K1) (24 mg, 0.055 mmol) were combined in a Schlenk flask with Pd(PPh$_3$)$_4$ (13 mg) in toluene (4.4 mL) and DMF (1.1 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=29.6 kDa and PDI=2.9).

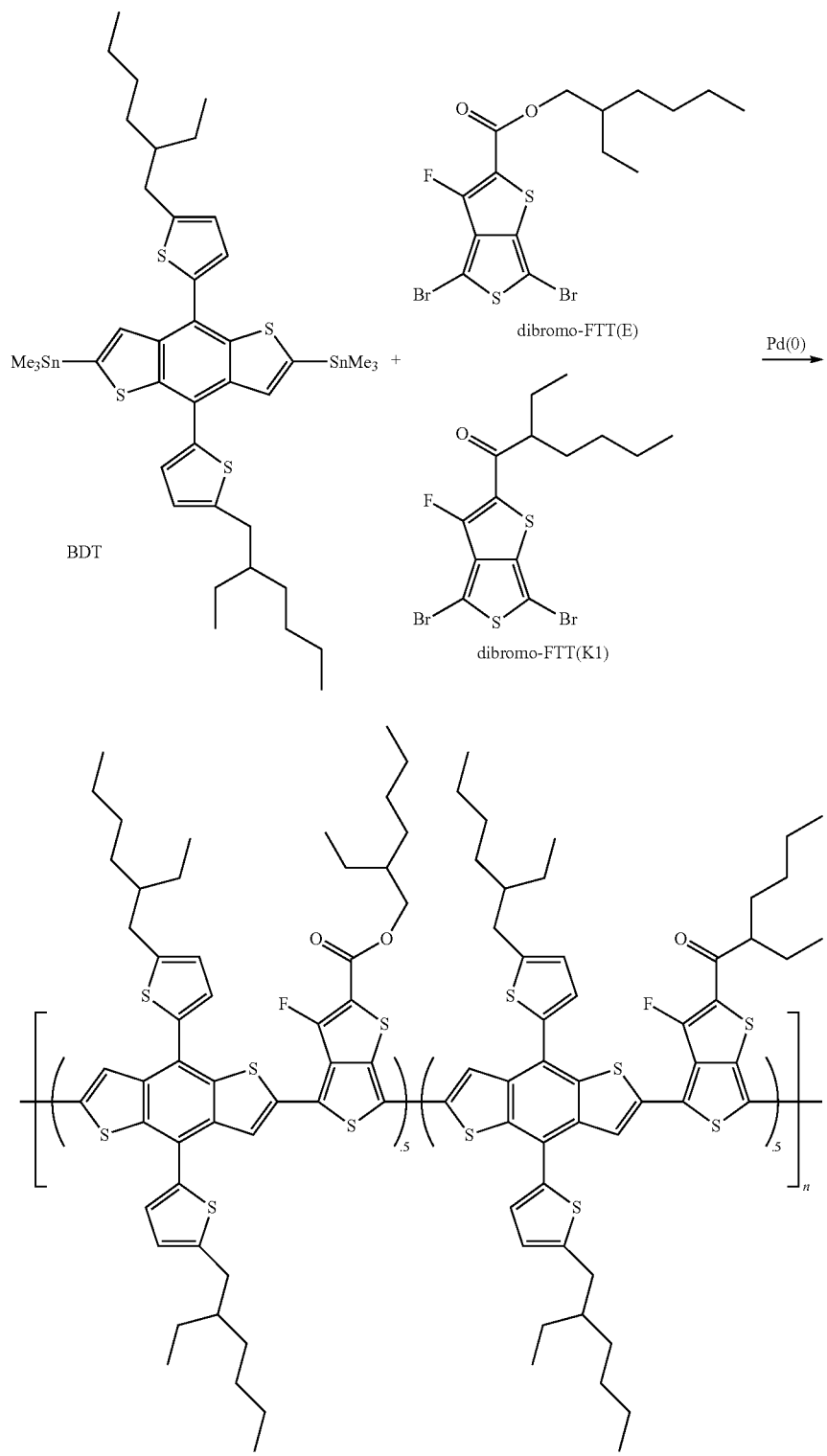

Example 9

P((BDT-FTT(E))$_{0.75}$-(BDT-FTT(K1))$_{0.25}$) Monomers distannyl-BDT (100 mg, 0.11 mmol)), dibromo-FTT(E) (39 mg, 0.0825 mmol) and dibromo-FTT(K1) were combined in a Schlenk flask with Pd(PPh$_3$)$_4$ (13 mg) in toluene (4.4 mL) and DMF (1.1 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction ($M_n$=20 kDa and PDI=2.43).

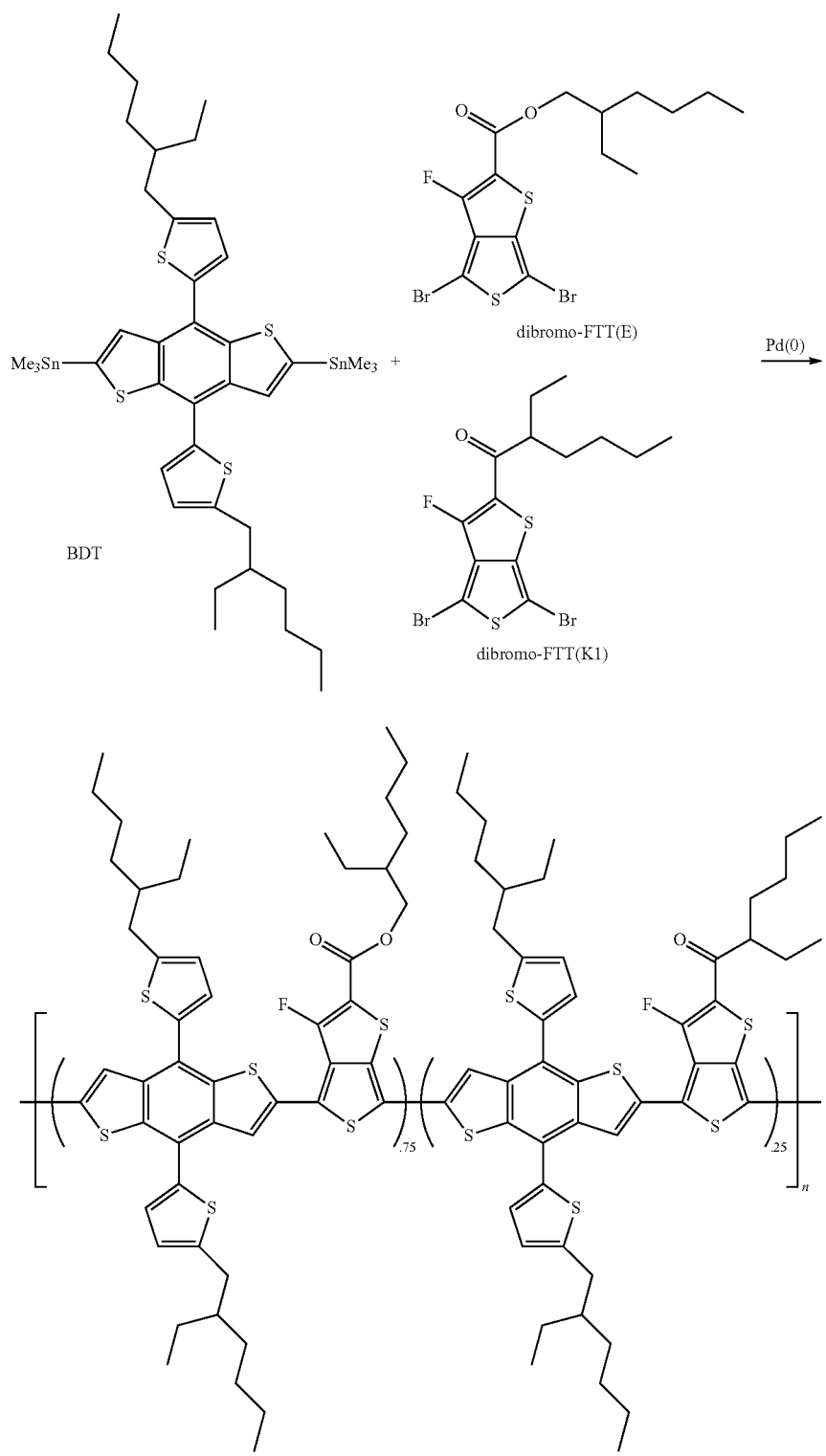

Example 10

P((BDT-FTT(E))$_{0.5}$-(BDT-FTT(K2))$_{0.5}$) Monomers distannyl-BDT (100 mg, 0.11 mmol)), dibromo-FTT(E) (26 mg, 0.055 mmol) and dibromo-FTT(K2) (21 mg, 0.055 mmol) were combined in a Schlenk flask with Pd(PPh$_3$)$_4$ (7 mg) in toluene (4.4 mL) and DMF (1.1 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction (M$_n$=23 kDa and PDI=1.4).

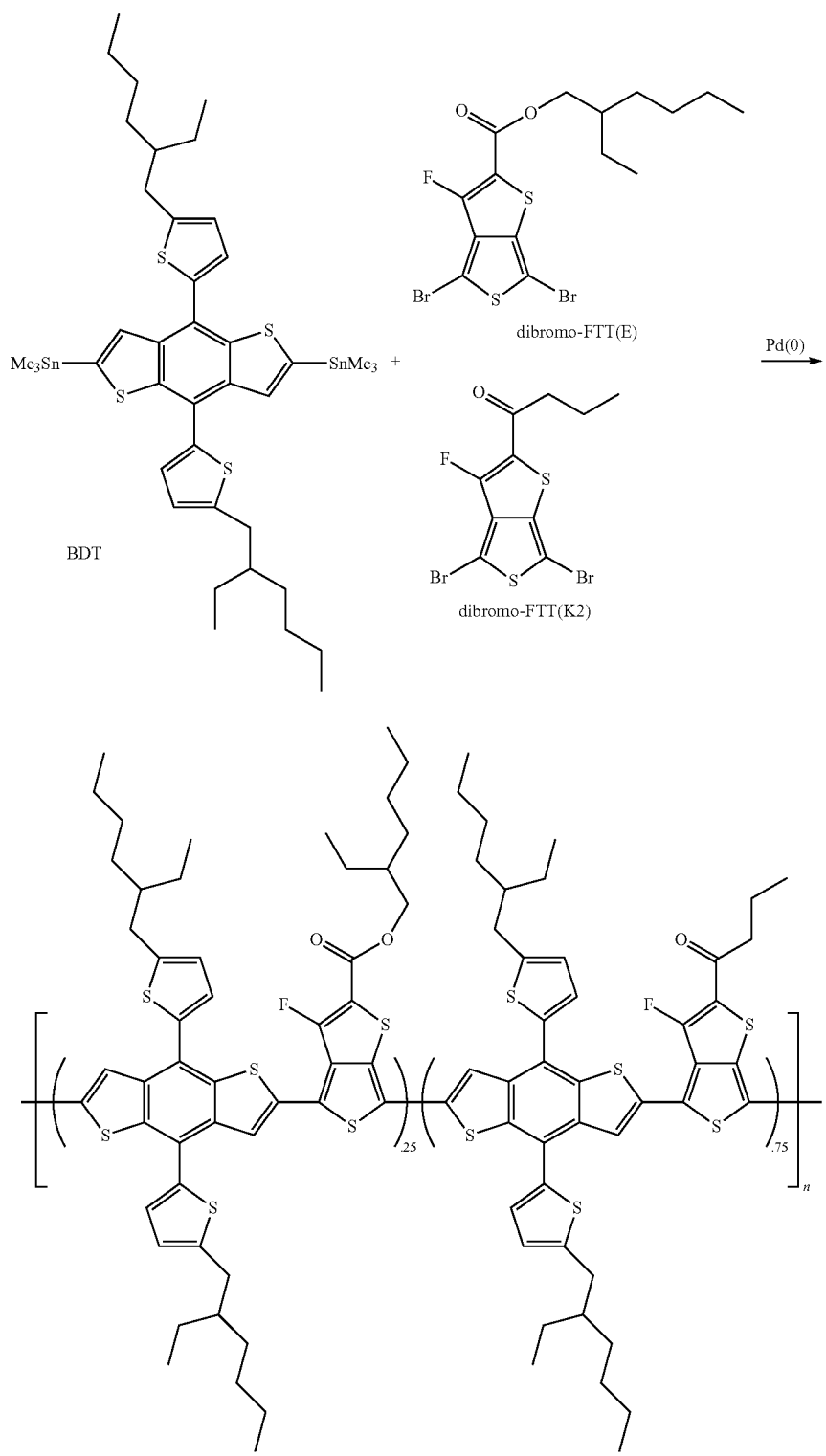

Example 11

P((BDT-FTT(P))$_{0.5}$-(BDT-FTT(K1))$_{0.5}$) Monomers distannyl-BDT (0.185 g, 0.21 mmol)), dibromo-FTT(P) (42 mg, 0.10 mmol) and dibromo-FTT(K1) (44 mg, 0.10 mmol) were combined in a Schlenk flask with Pd(PPh$_3$)$_4$ (32 mg) in toluene (9 mL) and DMF (3 mL). The solution was heated to 120° C. and stirred for 48 h. The solution was poured into 100 mL methanol and the polymer was collected by filtration. The polymer was purified by Soxhlet extraction by washing subsequently with acetone, hexanes and chloroform. The polymer was recovered in the chloroform fraction (M$_n$=16 kDa and PDI=1.9).

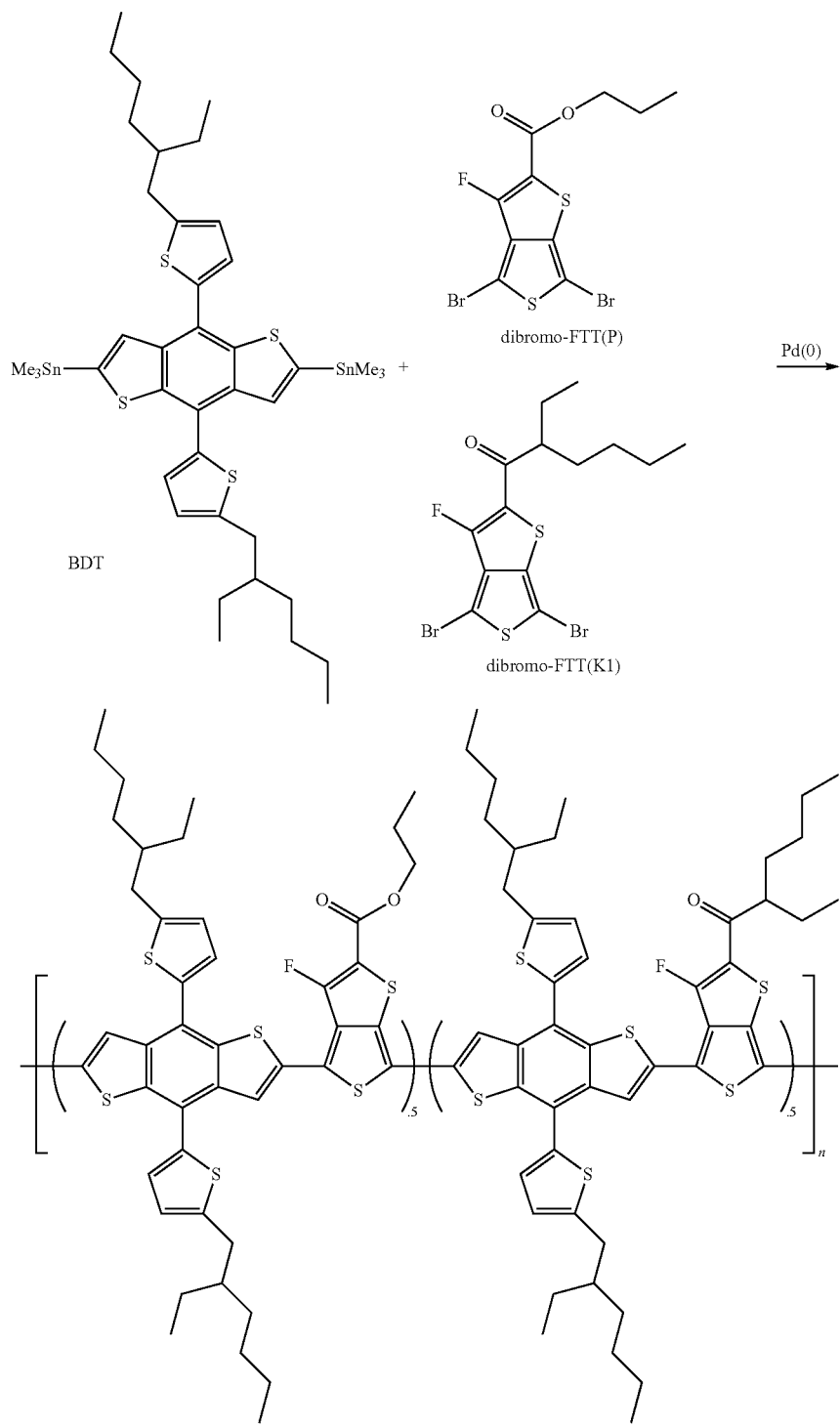

Example 12

Synthesis of P((BDT-FTTM)$_{0.25}$-(BDT-FTTE)$_{0.75}$): In a 50 mL Schlenk flask, BDTE (150.0 mg, 0.166 mmol) and FTTE (55.93 mg, 0.118 mmol) and FTTM (14.77 mg, 0.039 mmol) and Pd(PPh$_3$)$_4$ (18.3 mg, 0.016 mmol) were added. The mixture was vacuumed and backfilled with argon twice before 7.5 mL of anhydrous toluene and 1.5 mL of anhydrous dimethylformamide were added. The solution was frozen by liquid nitrogen and then vacuumed, backfilled with argon and thawed twice before heated to 120° C. for 20 hours. The product was precipitated out in 40 mL methanol and purified by Soxhlet extraction, methanol (16 hour), acetone (8 hour), hexane (16 hour) and dichloromethane (4 hour) and then chloroform 2 hour. The portion from dichloromethane was the main product (62 mg, yield 43.1%) after precipitated from methanol and then dried overnight.

Example 13

Synthesis of P((BDT-FTTM)$_{0.5}$-(BDT-FTTE)$_{0.5}$): In a 50 mL Schlenk flask, BDTE (100.0 mg, 0.106 mmol) and FTTE (24.86 mg, 0.053 mmol) and FTTM (19.69 mg, 0.053 mmol) and Pd(PPh$_3$)$_4$ (12.2 mg, 0.011 mmol) were added. The mixture was vacuumed and backfilled with Argon twice before 7.5 mL of anhydrous toluene and 1.5 mL of anhydrous dimethylformamide were added. The solution was frozen by liquid nitrogen and then vacuumed, backfilled with Argon and thawed twice before heated to 120° C. for 20 hours. The product was precipitated out in 40 mL methanol and purified by Soxhlet extraction, methanol (16 hour), acetone (8 hour), hexane (16 hour) and dichloromethane (4 hour) and then chloroform 2 hour. The portion from dichloromethane was the main product (60 and 24 mg respectively, yield 60.0%) after precipitated from methanol and then dried overnight.

Example 14

Synthesis of P((BDT-FTTM)$_{0.75}$-(BDT-FTTE)$_{0.25}$): In a 50 mL Schlenk flask, BDTE (150.0 mg, 0.166 mmol) and FTTE (18.65 mg, 0.039 mmol) and FTTM (44.3, 0.118 mmol) and Pd(PPh$_3$)$_4$ (18.3 mg, 0.016 mmol) were added. The mixture was vacuumed and backfilled with Argon twice before 7.5 mL of anhydrous toluene and 1.5 mL of anhydrous dimethylformamide were added. The solution was frozen by liquid nitrogen and then vacuumed, backfilled with Argon and thawed twice before heated to 120° C. for 20 hours. The product was precipitated out in 40 mL methanol and purified by Soxhlet extraction, methanol (16 hour), acetone (8 hour), hexane (16 hour) and dichloromethane (4 hour) and then chloroform 2 hour. The portion from chloroform was the main product (116 mg, yield 85.5%) after precipitated from methanol and then dried overnight.

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Device Fabrication and Measurement

ZnO sol-gel was prepared by dissolving zinc acetate dihydrate (220 mg, 1 mmol) and ethanolamine (62 mg, 1 mmol) into 2-methoxyethanol (2 mL) and stirred for 1 h in air. ITO-coated glass substrates were washed with detergent (15 min), DI water (2×15 min), acetone (15 min), and isopropanol (15 min) in an ultrasonication bath. The substrates were placed in a vacuum oven at 80° C. for 2 h and placed in a UV-ozone cleaner for 15 minutes. After filtration with a 0.2 μm PVDF syringe filter, ZnO sol-gel was spin-coated onto the top of the ITO substrate at 5000 rpm for 30 s (acceleration 5000 rpm). The substrate was annealed at 170° C. in air for 15 min and taken into glove box for deposition of the active layer. At the same time, 10 mg of P(BDT-FTT) and 16 mg of PC$_{70}$BM were mixed in ortho-xylene (1 mL) and stirred at 100° C. for 12 h. Diiodooctane (25 μL) was added to the solution and stirred for an additional 1 h, followed by filtration through a 0.45 μm PTFE syringe filter. Afterwards, the solution was coated on the substrate at 1,800, 2,000, and 2,200 rpm for 20 s. The substrate was solvent annealed inside of glass dishes for 1 h. After solvent annealing, the substrate was scratched at the edge to expose the ITO layer for the metal deposition. The substances were placed in the metal evaporator, and 14 nm of MoO$_3$ and 100 nm of Ag were deposited. The deposition speed for the MoO$_3$ was 0.5 Å/s. The deposition speed for Ag started at 0.5 Å/s until 5 nm was deposited. Afterward, the speed increased to 1-1.5 Å/s until 100 nm was deposited. The devices were encapsulated using UV-curable epoxy and a cover glass, and exposed to UV cure for 10 min.

The current density-voltage (J-V) curves were measured using a Keithley 2400 source meter. The photocurrent was measured under AM 1.5 G illumination at 100 mW/cm$^2$ under Newport Thermal Oriel 91192 1000 W solar simulator (4"×4" beam size). The light intensity was calibrated by a mono-silicon detector (with KG-5 visible color filter) calibrated by National Renewable Energy Laboratory to minimize spectral mismatch.

Table 1 depicts the solar cell performance of polymers from Examples 1-6.

| Examples | FTT(E):FTT(P) ratio | $V_{oc}$ (V) | $J_{sc}$ (mA/cm$^2$) | Fill Factor (%) | PCE (%) | $R_s$ (Ω·cm$^2$) | $R_{sh}$ (Ω) |
|---|---|---|---|---|---|---|---|
| 1 | 0:1 | 0.740 | 17.3 | 62.4 | 7.99 | 4.6 | 5723 |
| 2 | 0.3:0.7 | 0.75 | 16.5 | 65.0 | 8.07 | 4.6 | 9412 |
| 3 | 0.5:0.5 | 0.77 | 16.5 | 70.1 | 8.90 | 3.4 | 9286 |
| 4 | 0.7:0.3 | 0.76 | 16.1 | 61.1 | 7.48 | 5.0 | 5547 |
| 5 | 0.9:0.1 | 0.80 | 14.5 | 65.5 | 7.60 | 5.2 | 7567 |
| 6 | 1:0 | 0.80 | 16.0 | 68.6 | 8.74 | 4.1 | 10504 |

Table 2 depicts the solar cell performance of polymers from Examples 7-9.

| Polymer | FTT(E):FTT(K1) ratio | $V_{oc}$ (V) | $J_{sc}$ (mA/cm$^2$) | Fill Factor (%) | PCE (%) | $R_s$ (Ω·cm$^2$) | $R_{sh}$ (Ω·cm$^2$) |
|---|---|---|---|---|---|---|---|
| Example 7 | 0.25:0.75 | 0.81 | 15.89 | 59.95 | 7.72 | 7.25 | 620 |
| 8 | 0.5:0.5 | 0.77 | 17.29 | 64.79 | 8.26 | 5.19 | 779 |
| 9 | 0.75:0.25 | 0.79 | 16.83 | 67.84 | 9.04 | 4.34 | 815 |

Table 3 depicts the solar cell performance of polymers from Example 10.

| Polymer | FTT(E):FTT(K2) ratio | $V_{oc}$ (V) | $J_{sc}$ (mA/cm$^2$) | Fill Factor (%) | PCE (%) | $R_s$ (Ω·cm$^2$) | $R_{sh}$ (Ω·cm$^2$) |
|---|---|---|---|---|---|---|---|
| Example 10 | 0.5:0.5 | 0.79 | 17.3 | 68 | 9.30 | 2.8 | 956 |

Table 4 depicts the solar cell performance of polymers from Example 11.

| Polymer | FTT(P):FTT(K1) ratio | $V_{oc}$ (V) | $J_{sc}$ (mA/cm$^2$) | Fill Factor (%) | PCE (%) | $R_s$ (Ω·cm$^2$) | $R_{sh}$ (Ω·cm$^2$) |
|---|---|---|---|---|---|---|---|
| Example 11 | 0.5:0.5 | 0.81 | 15.77 | 63.49 | 8.11 | 4.97 | 713 |

Example 12

The polymer derivative of example 3 was further optimized in devices. A device structure was used which included a [6,6]-phenyl C61 butyric acid 2-hydroxyethyl ester (PCBE-OH) doped ZnO film as an interfacial layer.

The resulting solar cell performance is depicted in FIG. 1 and Table 2 below. The $V_{oc}$ for this device slightly higher compared to the above fabrication method, and the $J_{sc}$ increases to 17.4 mA/cm².

TABLE 2

| Polymer | Device Structure | $V_{oc}$ (V) | $J_{sc}$ (mA/cm²) | Fill Factor (%) | PCE (%) | $R_s$ (Ω·cm²) | $R_{sh}$ (Ω) |
|---|---|---|---|---|---|---|---|
| Example 3 | ITO/ZnO/ ZnO—PCBOH/ active layer/ MoO₃/Ag | 0.79 | 17.4 | 69.0 | 9.46 | 3.7 | 8311 |

TABLE 6

| | Monomer ratio | | | $V_{oc}$ | $J_{sc}$ | FF | PCE |
|---|---|---|---|---|---|---|---|
| Polymer | FTTM | FTTE | BDTE | (V) | (mAcm⁻²) | (%) | (%) |
| Example 6 | 0 | 100 | 100 | 0.80 | 15.2 | 68.8 | 8.38 |
| Example 12 | 25 | 75 | 100 | 0.78 | 14.6 | 62.7 | 7.12 |
| Example 13 | 50 | 50 | 100 | 0.77 | 16.6 | 72.1 | 9.15 |
| Example 14 | 75 | 25 | 100 | 0.72 | 16.8 | 58.7 | 7.18 |

In closing, it should be noted that the discussion of any reference is not an admission that it is prior art to the present invention, especially any reference that may have a publication date after the priority date of this application. At the same time, each and every claim below is hereby incorporated into this detailed description or specification as an additional embodiment of the present invention.

Although the systems and processes described herein have been described in detail, it should be understood that various changes, substitutions, and alterations can be made without departing from the spirit and scope of the invention as defined by the following claims. Those skilled in the art may be able to study the preferred embodiments and identify other ways to practice the invention that are not exactly as described herein. It is the intent of the inventors that variations and equivalents of the invention are within the scope of the claims while the description, abstract and drawings are not to be used to limit the scope of the invention. The invention is specifically intended to be as broad as the claims below and their equivalents.

The invention claimed is:

1. A process consisting essentially of:
polymerizing

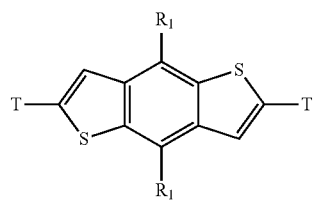

f with

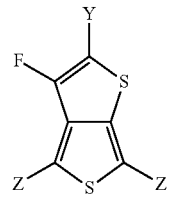

g and

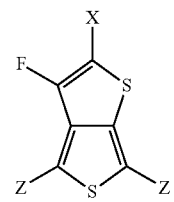

h wherein the stoichiometric ratio of f≈(g+h) and f, g and h are not equal to 0;

wherein

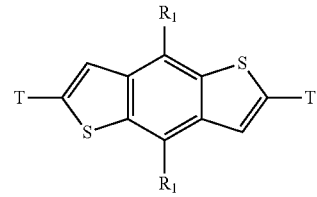

is a di-Me3Sn substituted benzo[1,2-b:4,5-b']dithiophene; and

X and Y are different from each other and independently selected from the group consisting of: alkyl group, alkoxy group, aryl groups,

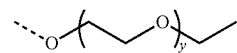

where y=1-3,

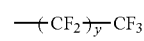

where y=0-12,

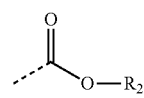

where R2 is selected from the group consisting of H, alkyl group, alkoxy group, aryl groups, where R3 is selected from the group consisting of H, alkyl group, alkoxy group, aryl groups, where R4 and R5 are independently selected from the group consisting of H, alkyl group, alkoxy group, aryl groups, —NR$_6$R$_7$ where R6 and R7 are independently selected from the group consisting of H, alkyl group, alkoxy group, aryl groups wherein T and Z are any functional groups used in the polymerization reaction.

2. The process of claim 1, wherein the aromatic substituents comprise of heterocycles and fused heterocycles.

3. The process of claim 1, wherein the process produces a conjugated polymer.

4. The process of claim 1, wherein the stille coupling of f, g and h is regio-regular.

5. The process of claim 1, wherein the stille coupling of f, g and h is regio-random.

6. The process of claim 1, wherein the process produces a photovoltaic material.

7. The process of claim 6, wherein the photovoltaic devices is used as a polymer solar cell device or photodetector device.

8. The process of claim 1, wherein the process produces an active layer material for one or more electronic devices.

9. The process of claim 8, wherein the one or more electronic devices are field effect transistors, light emitting devices, and sensors, electrochromic devices and capacitors.

10. The process of claim 1, wherein the ratio of used in the process is around 50:50.

11. A process consisting essentially of:
polymerizing f with g and h wherein the stoichiometric ratio of f≈(g+h) and f, g and h are not equal to 0;

wherein is a brominated 2-ethylhexyl substituted 3-fluorothieno[3,4-b]thiophene and wherein R1 are selected from the group consisting of alkyl group, alkoxy group, aryl groups and combinations thereof; and X and Y are different from each other and independently selected from the group consisting of: alkyl group, alkoxy group, aryl groups, where y=1-3, —(CF$_2$)$_y$—CF$_3$ where y=0-12, where R2 is selected from the group consisting of H, alkyl group, alkoxy group, aryl groups, where R3 is selected from the group consisting of H, alkyl group, alkoxy group, aryl groups,

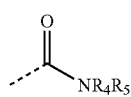

where R4 and R5 are independently selected from the group consisting of H, alkyl group, alkoxy group, aryl groups, —NR$_6$R$_7$ where R6 and R7 are independently selected from the group consisting of H, alkyl group, alkoxy group, aryl groups wherein T and Z are any functional groups used in the polymerization reaction.

12. The process of claim 1, wherein

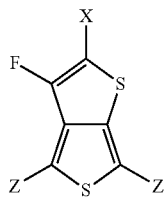

is a brominated propyl substituted 3-fluorothieno[3,4-b]thiophene.

13. The process of claim 1, wherein the polymerizing reaction comprises: stille coupling, suzuki coupling, a nickel catalyzed reaction or direct arylation.

14. The process of claim 1, wherein functional group T of components f and g reacts exclusively with functional group Z of components h and i.

15. The process of claim 1, wherein T is selected from the group consisting of Me$_3$Sn, C$_6$H$_{12}$, O$_2$B, Br and combinations thereof.

16. A process consisting of:

polymerizing

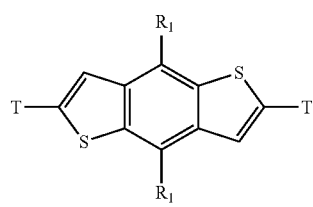

f with

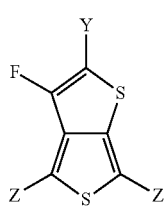

g and

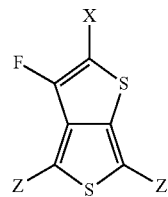

h wherein the stoichiometric ratio of f≈(g+h) and f, g and h are not equal to 0; wherein functional group T of component f reacts exclusively with functional group Z of components g and h wherein

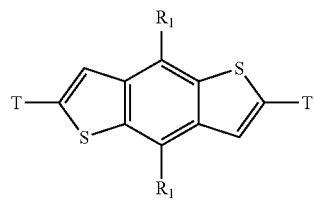

is a di-Me3Sn substituted benzo[1,2-b:4,5-b']dithiophene; and

X and Y are different from each other and independently selected from the group consisting of: alkyl group, alkoxy group, aryl groups

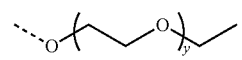

where y=1-3,

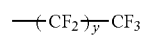

where y=0-12,

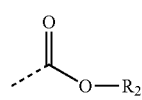

where R2 is selected from the group consisting of H, alkyl group, alkoxy group, aryl groups,

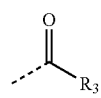

where R3 is selected from the group consisting of H, alkyl group, alkoxy group, aryl groups,

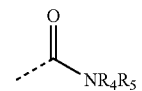

where R4 and R5 are independently selected from the group consisting of H, alkyl group, alkoxy group, aryl groups, —NR$_6$R$_7$ where R6 and R7 are independently selected from the group consisting of H, alkyl group, alkoxy group, aryl groups and the polymerization f, g and h are selected from stille coupling, suzuki coupling, a nickel catalyzed reaction or direct arylation wherein T and Z are any functional groups used in the polymerization reaction.

17. A process consisting of:
polymerizing

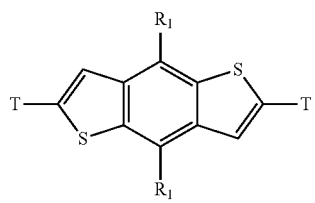

f with

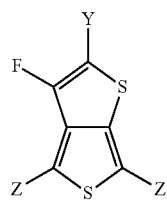

g and

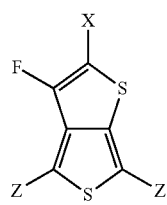

wherein the stoichiometric ratio of f≈(g+h) and f, g and h are not equal to 0; wherein functional group T of component f reacts exclusively with functional group Z of components g and h
wherein

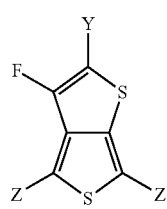

is a brominated 2-ethylhexyl substituted 3-fluorothieno[3,4-b]thiophene and wherein R1 are selected from the group consisting of alkyl group, alkoxy group, aryl groups and combinations thereof; and X and Y are different from each other and independently selected from the group consisting of: alkyl group, alkoxy group, aryl groups,

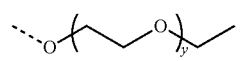

where y=1-3,

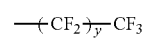

where y=0-12,

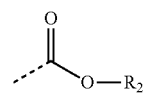

where R2 is selected from the group consisting of H, alkyl group, alkoxy group, aryl groups,

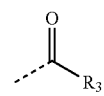

where R3 is selected from the group consisting of H, alkyl group, alkoxy group, aryl groups,

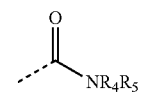

where R4 and R5 are independently selected from the group consisting of H, alkyl group, alkoxy group, aryl groups, —NR$_6$R$_7$ where R6 and R7 are independently selected from the group consisting of H, alkyl group, alkoxy group, aryl groups and the polymerization f, g and h are selected from stille coupling, suzuki coupling, a nickel catalyzed reaction or direct arylation wherein T and Z are any functional groups used in the polymerization reaction.

* * * * *